United States Patent
Lee et al.

(10) Patent No.: US 6,958,640 B2
(45) Date of Patent: Oct. 25, 2005

(54) INTERPOLATION DELAY CELL FOR 2PS RESOLUTION JITTER INJECTOR IN OPTICAL LINK TRANSCEIVER

(75) Inventors: KyeHyung Lee, Corvallis, OR (US); Jianping Xu, Portland, OR (US); Fabrice Paillet, Hillsboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 24 days.

(21) Appl. No.: 10/748,300

(22) Filed: Dec. 31, 2003

(65) Prior Publication Data

US 2005/0140412 A1    Jun. 30, 2005

(51) Int. Cl.[7] .............................................. H03H 11/26
(52) U.S. Cl. ...................................... 327/261; 327/280
(58) Field of Search ................................ 327/261, 262, 327/263, 264, 266, 268, 271, 272, 274, 277, 327/278, 280, 287, 288

(56) References Cited

U.S. PATENT DOCUMENTS

| | | | |
|---|---|---|---|
| 5,051,628 A | * | 9/1991 | Hanna ......................... 327/553 |
| 5,362,988 A | * | 11/1994 | Hellums ...................... 327/543 |
| 6,351,191 B1 | | 2/2002 | Nair et al. ..................... 331/57 |
| 6,480,433 B2 | * | 11/2002 | Huffman ...................... 365/201 |
| 6,611,468 B2 | * | 8/2003 | Nojiri et al. ................. 365/207 |
| 6,724,230 B2 | * | 4/2004 | Hirabayashi ................ 327/280 |

OTHER PUBLICATIONS

Noda et al. "An On-Chip Timing Adjuster with SUB-100-PS Resolution for a High-Speed DRAM Interface," 1998 Symposium on VLSI Circuits Digest of Technical Papers, pp. 62-63.

John G. Maneatis "Low-Jitter Process-Independent DLL and PLL Based on Self-Biased Techniques," IEEE Journal of Solid-State Circuits, vol. 31, No. 11, Nov. 1996, pp. 1723-1732.

* cited by examiner

*Primary Examiner*—Linh My Nguyen
(74) *Attorney, Agent, or Firm*—Fleshner & Kim, LLP

(57) ABSTRACT

An apparatus and method for generating signals with improved timing resolution includes a delay cell configured to receive dual coupled differential input signals. The delay cell performs an interpolation function which smooths state transitions or other discontinuities that result from timing or phase offsets between the input signals. The interpolation function is performed by resistors which couple respective components of the differential inputs prior to traversing delay paths. A delay cell of this type has high supply noise rejection and a low output swing range, thereby making it suitable for a number of applications. One application includes a jitter noise generator which uses the delay cell to achieve improved timing resolution and which is not limited by a minimum delay of the cell. Another application uses the delay cell to form a coupled delay line.

27 Claims, 7 Drawing Sheets

INTERPOLATION DELAY CELL FOR 2PS RESOLUTION JITTER INJECTOR IN OPTICAL LINK TRANSCEIVER

FIELD

This invention generally relates to delay circuits and their applications to programmable jitter injectors.

BACKGROUND OF THE INVENTION

High-speed communication systems use recovery circuits to regenerate clock and data signals from scrambled inputs that have been corrupted by jitter, inter symbol interference, and other forms of noise. In order to evaluate the performance of clock and data recovery circuits in an optical link receiver without any photonic devices or electro-optical conversion, a circuit known as jitter noise generator has been used.

More specifically, during normal operating conditions an optical receiver is expected to receive data which is corrupted by noise. In order to evaluate its performance limitations, the receiver can be tested without connecting it to an optical link. A jitter noise generator is one type of testing device that can be used for this purpose. During a test, a jitter noise injector inputs noise into the receiver in order to simulate actual operating conditions. Output data is then evaluated to determine the level of optical link noise the receiver can tolerate as well as other performance parameters.

The performance capabilities of jitter noise generators have a direct effect on noise tolerance. These capabilities are largely constrained by the inherent limitations of their internal delays cells. One delay cell which has been proposed for use in a jitter noise generator is shown in FIG. 1. This cell includes a load composed of four transistors P1–P4, a current source CS, two nodes for receiving a differential input signal IP and IN through respective transistors T5 and T6, and two nodes for supplying a differential output signal OP and ON.

The FIG. 1 delay cell has proven to significantly limit the tuning range and timing resolution of jitter noise generators, as well as other circuits. Timing resolution is limited, for example, by the minimum delay of the cell. This, in turn, limits ability of the generator to evaluate the performance of clock and data recovery circuits, which are vital to ensuring proper operation of high-speed communication and signaling systems. Also, because the delay cell accepts only one input, it cannot perform phase interpolation for its input signal that may be desirable for evaluating performance of the receiver.

DETAILED DESCRIPTION

Figure 2:
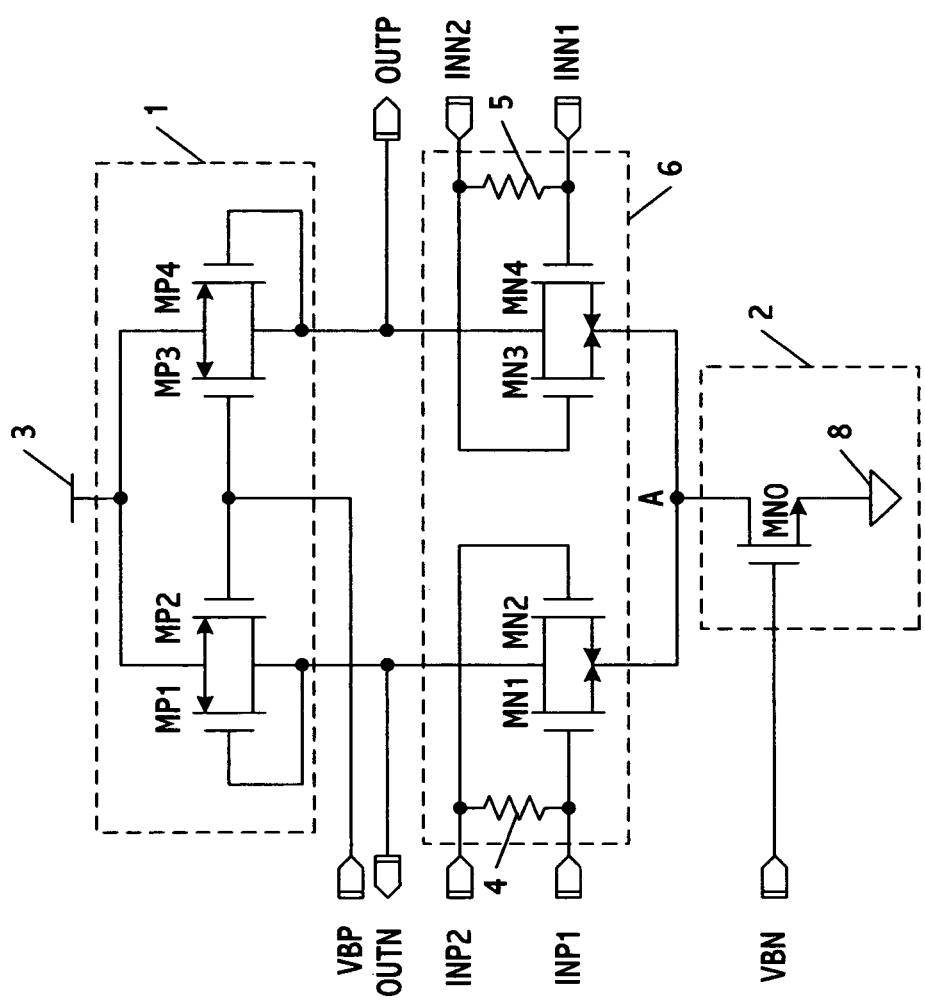
FIG. 2 is a diagram showing a delay cell in accordance with one embodiment of the present invention.

FIG. 2 shows a delay cell in accordance with a first embodiment of the present invention. The delay cell includes dual coupled differential input lines connected between a load 1 and a current source 2, a line 3 which functions as a power supply for the delay cell, and a differential output line coupled between the differential input lines and the load. These elements are preferably implemented using CMOS technology as described in greater detail below. VBP serves as a delay control line for the cell.

The load is preferably formed from a symmetrical arrangement of two pairs of coupled transistors. The first pair of transistors MP1 and MP2 have their sources and drains coupled together, and a gate of MP1 is connected to the common drain of MP1 and MP2. The second pair of transistors MP3 and MP4 are connected in a similar manner, i.e., the sources and drains of these transistors are connected and the gate of MP4 is connected to the common drain of MP3 and MP4. In this embodiment, all four load transistors are connected to the delay control line.

Using a symmetric load is desirable because it demonstrates a linear characteristic throughout a substantial range of operating frequencies and voltages. This linearity, for example, allows the load transistors to operate with very small source-to-drain voltage, and also allows relatively low power supply voltages to be used while simultaneously achieving a low output voltage swing range. As a result, the delay cell is able to achieve high frequency operation with very low supply voltage. (The output swing range may be measured based on a difference between a sub-rail load bias voltage VBP and power supply voltage input into the delay control line.)

The linearity of the symmetric load also provides superior power noise rejection, which translates into improved signal-to-noise ratio in the differential signal output of the cell. The symmetric load therefore effectively operates as a filter for rejecting power and high-frequency noise. While a symmetric load is preferable for at least the aforementioned reasons, other load configurations may be used if desired.

The current source includes a transistor MN0 having a source connected to a reference potential 8 and a gate connected to a bias voltage VBN. The bias voltage may be selected to bias the current source to operate in a linear region, and by changing this voltage the output of the current source may be adjusted within a desired operating range. While the bias voltage is adjustable, in this differential embodiment it may be preferable to make the current source a constant current source. The drain node of this device should therefore act like a virtual ground, and the current source transistor may be a long channel device operating in a near-saturation region.

The bias of the current source and load transistors may be controlled through an appropriate selection of VBN and VBP, so that the product of the resistance of the load and the current from the current source is substantially constant. This results in a constant swing voltage in the differential output. For many applications, this may prove to be beneficial, as the swing voltage may be selected to reside within a low output swing range. The power supply voltage may also be varied under these circumstances without producing any substantial change in the output swing voltage.

The dual coupled differential input signals are connected between the current source and load, and are generally shown as residing in differential input section 6. The first differential input signal consists of INP1 and INN1 which are respectively connected to gates of transistors MN1 and MN4. The second differential input signal consists of INP2 and INN2 which are respectively connected to gates of transistors MN2 and MN3. The differential input signals may be generated by different differential sources including, for example, any type of differential delay element or phase interpolator. Differential components INP1 and INP2 are positive and INN1 and INN2 are negative inputs fed to opposing sides of the delay cell. Differential inputs INP1 and INP2 are coupled by a resistor 4, and inputs INN1 and INN2 are coupled by a resistor 5. This coupling is considered advantageous for reasons that will become more apparent below.

Transistors MN1 and MN2 have common sources and drains, where the common drain is connected to the drains of load transistors MP1 and MP2 and the common source is connected to the current source through node A. Transistors MN3 and MN4 have common sources and drains, where the common drain is connected to the drains of load transistors MP3 and MP4 and the common source is connected to the current source through node A.

The differential output nodes OUTN and OUTP are also connected between the current source and load, with OUTN residing between the first coupled differential input signal and load transistor pair MP1, MP2 and OUTP residing between the second coupled differential input signal and load transistor pair MP3, MP4.

Current to operate the delay cell is provided by the device which drives the delay control line. This device may be any number of circuits depending on the specific application. For example, when used to form the coupled delay line described below, line 3 may provide the control voltage of a voltage-controlled oscillator incorporating the delay line. Irrespective of the application, in the embodiment of FIG. 2, as the voltage on the delay control line changes, the resistance of the load transistors changes along with the flow of current in the current source. These changes effect a proportional change in the delay time of the delay cell, which is reflected in the differential output of this circuit. (In a VCO-implementation, the change in delay time changes the frequency of the VCO output signal, e.g., small delay times produce large output frequencies and vice versa). The FIG. 2 embodiment of the delay cell is implemented in CMOS, where current source transistor MN0 and differential input transistors MN1–MN4 are n-type transistors and the load transistors are p-type transistors.

In operation, voltages VBN and VBP are input into the current source and load transistors to respectively bias the delay cell in a predetermined manner. Also, the delay control line inputs a voltage which serves as both a power supply and a value which sets a delay time at the differential output. The coupled differential input signals are then received. The differential input signals may have an opposing relationship to one another, e.g., INP1 and INN1 may be large voltages and INP2 and INN2 may be relatively small voltages. Differential components INN1 and INN2 preferably have the same voltage but differ in phase, and the same is true of INP1 and INP2. Together, INP1 and INN1 define the first differential input signal and INN2 and INP2 define the second differential input signal.

When INP1 and INP2 are received, output signals OUTN and OUTP begins to change state. If these inputs have timing or phase differences, the output signals begin to change when the first input arrives and the output signals finish their transitions when the second input arrives. The effective low-swing transition at the output therefore behaves like a state change between the input signal transition. This is called phase interpolation.

When the inputs have timing or phase differences or when other conditions exist, the state transition may not be a smooth continuous time-varying signal. The value of the output depends on the exact sampling point. The resistor 4 which couples INP1 and INP2 smooths this output transition, i.e., the resistor filters the discontinuity in the output transition. Preferably, the resistor provides a near-linear state transition which is an exact interpolation between the two inputs. The resistor value may be selected by taking into consideration the tradeoff that exists between transition time and energy dissipated in the resistor.

The same effect exists when timing or phase differences exist between INN1 and INN2, since these signals are the differential counterparts of INP1 and INP2 respectively. The resistor 5 couples INN1 and INN2 to produce a smooth, continuous time-varying output signal.

Figure 3:
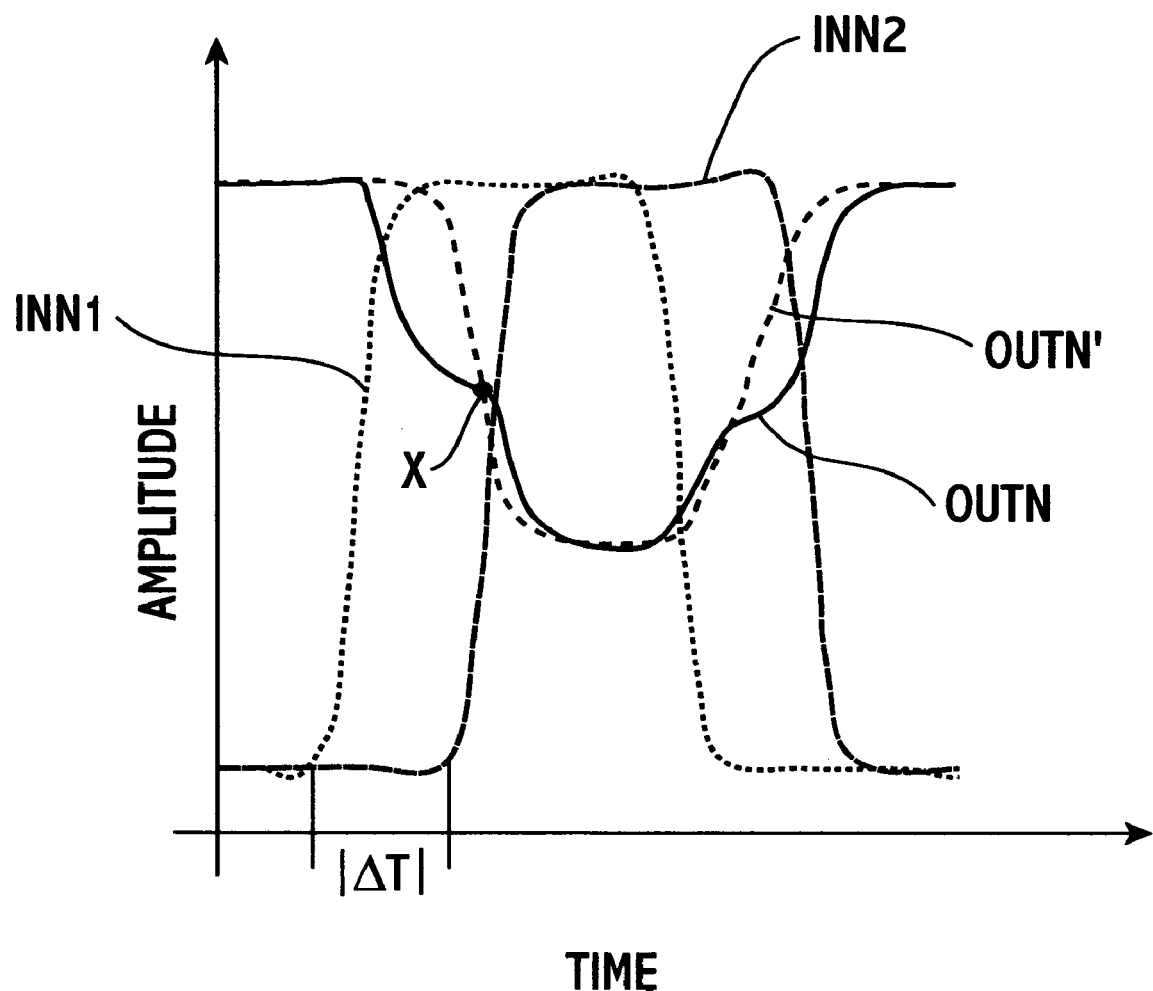
FIG. 3 is a timing diagram showing output signals produced under two conditions, namely when a resistor is not used to couple differential signals input into the cell and when a resistor is used to couple the differential signals input into the cell.

FIG. 3 is a timing diagram showing examples of output signals generated when differential input signals INN1 and INN2 are and are not subjected to resistive coupling. The horizontal axis of this diagram shows time coordinates and the vertical axis amplitude coordinates, and a time offset ΔT is shown to exist between the input signals. This offset creates a step transition in the output which, if left uncorrected, will generate undesirable distortion.

More specifically, the output signal generated without the coupling resistor is shown as OUTN and the signal generated with the coupling resistor is shown as OUTN'. For OUTN, a state transition begins at a time approximately coincident with the rising edge of INN1. The slope of this curve changes at point X with the rising edge of INN2, thereby creating a discontinuity or step transition which is undesirable. The coupling resistor smooths this discontinuity by delaying the output signal for an amount of time that causes a smooth transition to occur, i.e., the value of the resistor is selected to produce a delay in OUTN' so that no discontinuity occurs at point X and therefore a smooth, continuous time-varying signal advantageously results.

The signals generated as a result of the resistive coupling are respectively input into the gates of transistors MN1 and MN2. When the input into MN1 arrives before MN2, the output signal begins to experience a state transition. As a result, current flows through MN1. When the input signal into MN2 arrives, current begins to flow through MN2. A small amount of current flows when only MN1 is on, and when MN2 is switched on a large amount of current flows. A state transition of the output signal begins when MN1 receives its input signal and this transition ends based on the input into MN2. Transistors MN3 and MN4 perform the opposite function of MN1 and MN2, i.e., one transistor starts switching off, cuts the current, and the second completely shuts off the current though them.

The input transistors output a signal whose value is modified by load resistors MP1 and MP2. The resulting signal is passed through the output node OUTN. The output swing in small signal analysis is developed across the parallel combination of the output resistance of the load and MN1–MN4 transistors. The load transistors also provide a way for the output signal to flip, e.g., change state. A resistive element should be placed between the power supply 3 and the output nodes to effect this change. The following equations describe how output voltages OUTN and OUTP are generated is this embodiment:

$$OUTN = \text{on resistance of } MP1//MP2//MN1//MN2 * \text{current}$$

$$OUTP = \text{on resistance of } MP3//MP4//MN3//MN4 * \text{current}$$

where // means a parallel combination of output resistance of the four devices and current equals the current flowing through the OUTP node from supply 3 to ground 8. The equations may also be re-stated as $$R(MP3)//R(MP4)//R(MN3)//R(MN4)*I(OUTP).$$

The delay cell, thus, delays the differential output signal OUTN and OUTP by an amount of time proportional to the switching delay of the MN1–MN4 transistors. This delay is produced as follows. Initially, NMOS transistors MN1 and MN2 are in the OFF state. These transistors receive a rising input at their gates which charge their gate capacitances. A conducting channel is thus formed from source to drain in these transistors and as a result current starts flowing. A low resistivity path forms from the drain to the source. The sources of these transistors are connected to virtual ground, which pulls the drain and thus OUTN low. The other side of the differential circuit performs in a reverse manner, so that OUTP gets pulled high by load devices (towards supply node) during this time.

As previously indicated, each resistor 4 and 5 introduces coupling between respective pairs of the input lines. The signals input into each input line pair have phase or timing differences, and finely interpolated signals are output as a differential signal produced as a result of the coupling. This may be explained as follows. INN1 and INN2 and their counterparts are generated by two different differential delay cells. They are controlled by VBP and the delay through the differential delay elements. As a signal goes through multiple differential delay cells, it automatically gets phase shifted by the transition delay though each delay cell. As a result, two edges of the signal are separated in phase by a transition delay.

The output between these two edges are shifted, resulting in a timing resolution change defining a phase interpolation. The interpolation for INP1 and INP2 is performed by transistors MN1 and MN2, and the interpolation of INN1 and INN2 is performed by transistor MN3 and MN4. This interpolation is reflected as a shift in phase in the differential output signal relative to the phase of the input signal. By coupling the cells in an array, a delay line can be formed which can achieve, for example, ±20 pS at 2 pS resolution.

Performing phase interpolation with respect to multiple coupled differential input signals is advantageous. For example, performing interpolation in this manner allows the delay cell to achieve finer tuning resolution compared with one-input delay cells, e.g., one-input cells do not interpolate between multiple input signals and thus cannot achieve the degree of a fine degree of resolution.

Figure 4:
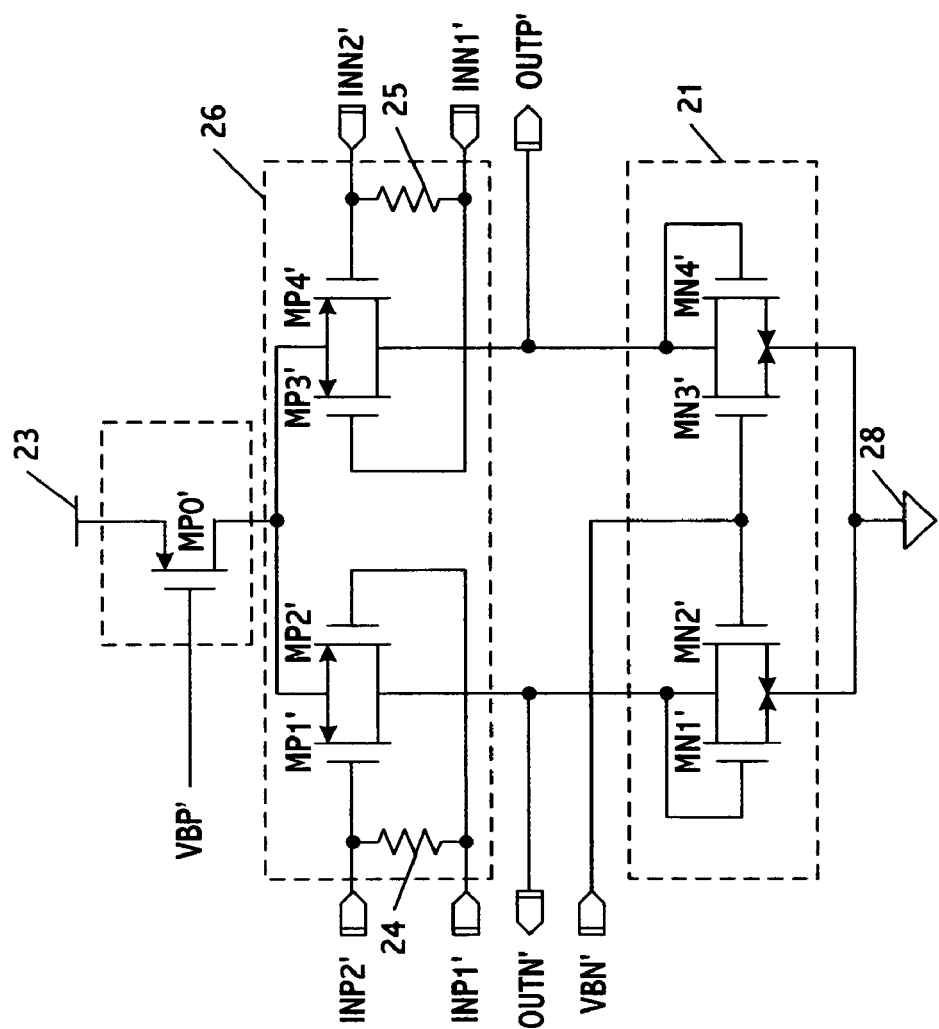
FIG. 4 is a diagram showing a delay cell in accordance with another embodiment of the present invention.

FIG. 4 is a diagram showing an interpolation delay cell in accordance with another embodiment of the present invention. This embodiment is an equivalent version of the FIG. 2 embodiment except that the differential input signals in section 26 are input into gates of respective p-type transistor pairs MP 1'–MP4' through resistors 24 and 25. The load 21 is formed from n-type transistors MN1'–MN4', common sources of which are connected to a reference potential 28. The current source is formed from p-type transistor MP0' connected between power supply line 23 and transistor pairs MP1'–MP4'. The load and current source are respectively biased by voltage signals VBN' and VBP', and differential output nodes OUTN' and OUTP' are coupled between the load and transistor pairs MP1'–MP4'.

In operation, voltages VBN' and VBP' are input into the current source and load transistors to bias the delay cell in a predetermined manner. The differential input signals are then received INP1' and INM2' may have the same voltage value but differ in phase, and the same may be true of INN1' and INN2'. Furthermore, INP1' and INP2' are in an opposing relationship with voltages and INN1' and INN2'. Together, INP1' and INN1' define a first differential input signal and INP2' and INN2' define a second differential input signal.

The coupling resistors 24 and 25 perform an analogous function to resistors 4 and 5; that is, these transistors perform a filter operation which shifts the phases of INP1', INN1' and INP2', INN2' respectively to an intermediate point between the two edge pairs. Thus, like in the FIG. 2 circuit, the dual input transistor pairs in the FIG. 4 circuit perform an interpolation function for input and output nodes inside the delay cell.

Figure 5:
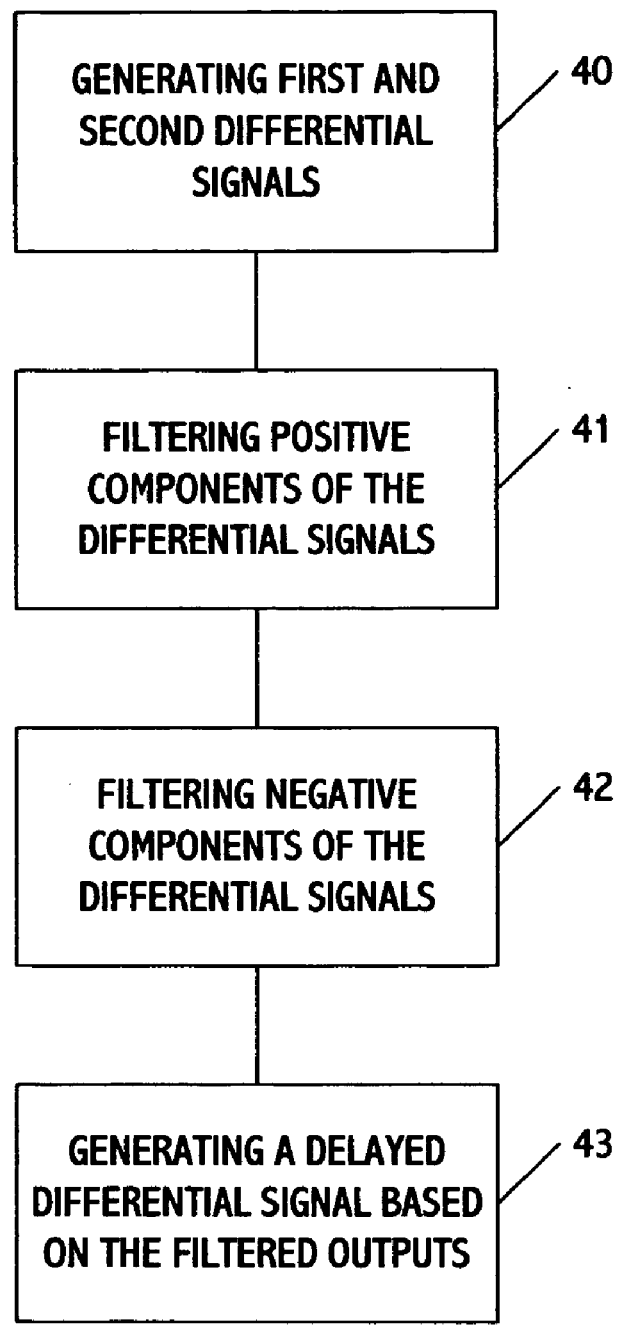
FIG. 5 is a diagram showing functional blocks included in a method for generating a delayed signal in accordance with one embodiment of the present invention.

FIG. 5 is a flow diagram showing functional blocks included in a method for delaying a signal in accordance with one embodiment of the present invention. In an initial block, two differential signals are generated, for example, by a differential delay element or phase interpolator. (Block 40). These signals are then input into a delay cell for phase interpolation. More specifically, because the differential signals may differ from one another in phase or time, a differential output signal from the delay cell may include an undesirable discontinuity or step transition. To smooth these effects, first components of the differential signals (e.g., INP1 and INP2) are filtered prior to input into the delay cell. (Block 41). Second components (e.g., INN1 and INN2) of the differential signals are filtered in a similar manner. (Block 42). Filtering the differential inputs in this manner delays the state transition of the output signal so that a smooth and continuous time-varying signal is generated at the differential outputs of the delay cell. (Block 43). The values of resistors 4 and 5 are selected to achieve this smooth transition. The differential signal output from the delay cell is generated based on current flowing between the current source and load when switching transistors MN1–MN4 are switched on by the filtered differential signals. An example of the delayed state transition and the resulting smooth output is shown in FIG. 3 discussed above.

Figure 1:
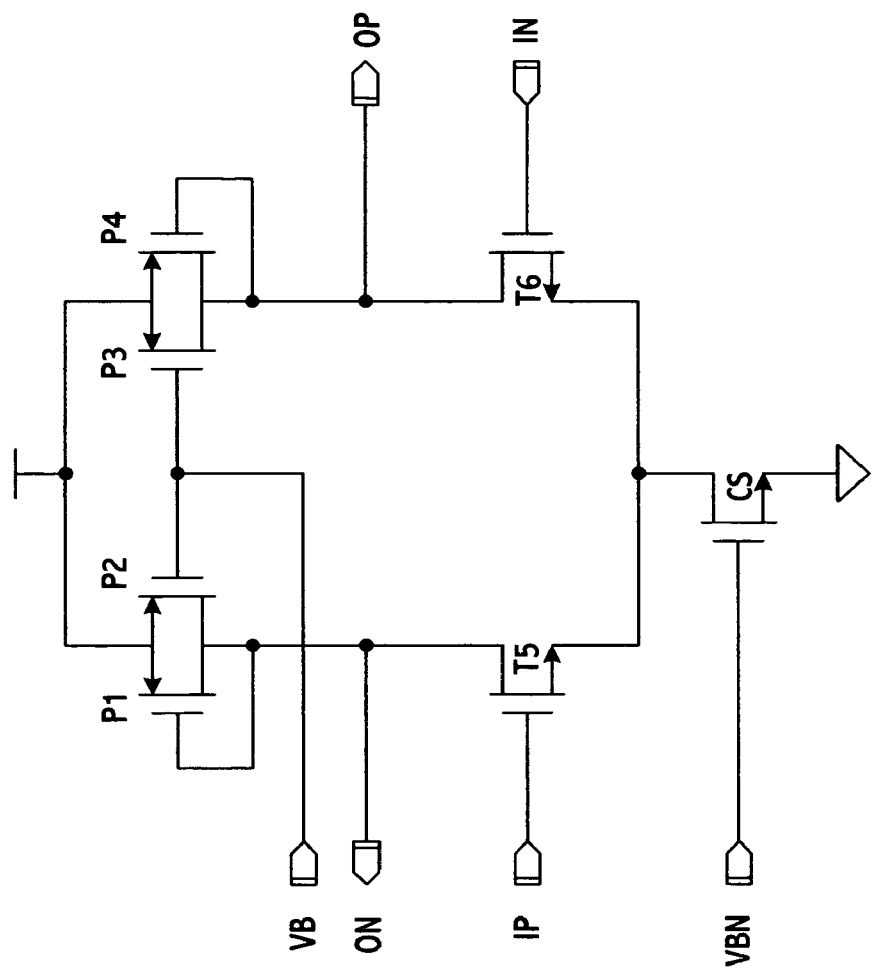
FIG. 1 is a diagram showing one type of delay cell which has been proposed for use in jitter noise generators.
Figure 6:
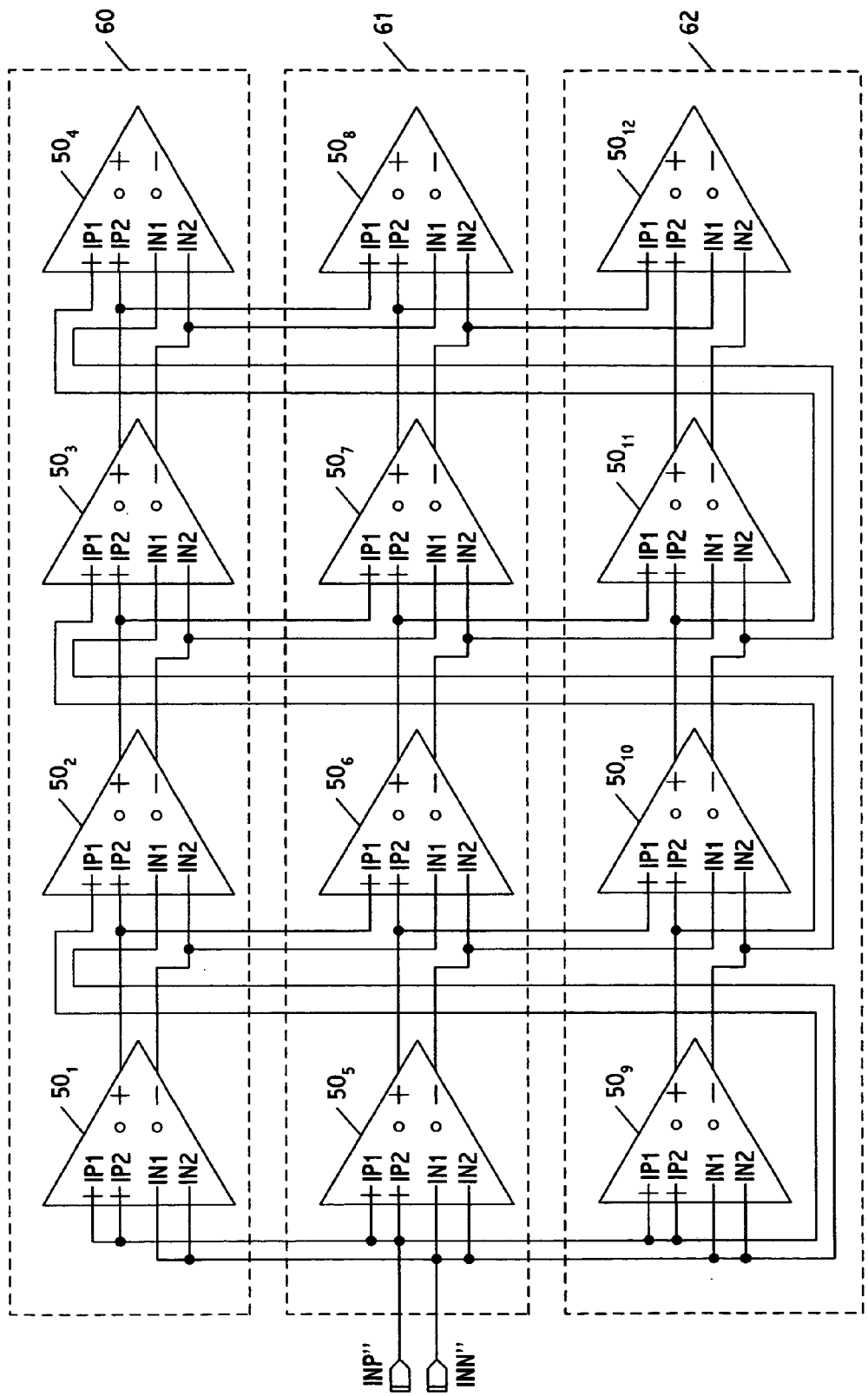
FIG. 6 is a diagram showing a coupled delay line which may be formed using any one of the embodiments of the delay cell of the present invention.

FIG. 6 shows a delay line in accordance with one embodiment of the present invention. The delay line is formed from an array of delay cells matching one of the embodiments of FIG. 1 or 2. In this embodiment, the delay cells are arranged in three banks 60,61, and 62 each containing four delay cells. While a total of twelve delay cells $50_1$–$50_{12}$ are shown in the delay line, a different number of cells and/or banks may be included to meet the specific requirements of an intended application.

In each bank, the delay cells are sequentially arranged so that the differential outputs of one delay cell are connected to corresponding differential inputs of one or more succeeding cells. More specifically, initially, a differential input signal consisting INP" and INN" are respectively input into the non-inverting terminals ip1/ip2 and inverting terminals in1/in2 of the first cell in each bank. Although not specifically shown, each signal pair supplied to differential terminals ip1/ip2 are coupled by a resistor prior to input. The same is true with the other differential terminal, e.g., each signal pair supplied to differential terminals in1/in2 are coupled by a resistor prior to input.

The differential signal output from the first cell in each bank is then input into corresponding differential inputs of two delay cells. Specifically, the signal output from the non-inverting terminal of delay cell $50_1$ is input into the ip2 terminal of delay cell $50_2$ and into the ip1 terminal of delay cell $50_6$. The signal output from the non-inverting terminal of delay cell $50_5$ is input into the ip2 terminal of delay cell $50_6$ and into the ip1 terminal of delay cell $50_{10}$. And, the signal output from the non-inverting terminal of delay cell $50_9$ is input into the ip2 terminal of delay cell $50_{10}$ and into the ip1 terminal of delay cell $50_3$.

In similar fashion, the signal output from the inverting terminal of delay cell $50_1$ is input into the in2 terminal of delay cell $50_2$ and into the in1 terminal of delay cell $50_6$. The signal output from the inverting terminal of delay cell $50_5$ is input into the in2 terminal of delay cell $50_6$ and into the in1 terminal of delay cell $50_{10}$. And, the signal output from the inverting terminal of delay cell $50_9$ is input into the in2 terminal of delay cell $50_{10}$ and into the in1 terminal of delay cell $50_3$. This pattern of connection continues until the last bank is reached. At this time, the differential output of the last delay cell in each bank may be supplied as a timing or control signal to another circuit or may be fed back as input signals INP" and INN" to the first cells in each bank. The delay imposed by each delay cell may be selective controlled by the delay control line of each cell.

The delay line of the aforementioned embodiment may advantageously perform an interpolation function in order to delay an input signal for a desired duration of time. The interpolation function may take place between the delay cells, and may be accomplished by combining the outputs of selected delay cells until the desired delay is produced. The combination of these outputs may be directly performed or may involve a weighted sum of the outputs, i.e., the output of each selected delay cell may be assigned a predetermined weight so that the combination generates a desired delay.

Through this selective combination and as a result of the resistive coupling that takes place between the differential signals input into each cell, the delay line is able to generate an output signal having a very precise delay with very fine phase differences. When implemented in a jitter noise generator application, the delay line is able to produce higher timing resolution than can be generated using other delay cells or delay lines. Moreover, the performance of the jitter noise generator is not limited to a minimum delay of each cell.

The phase interpolation performed by the delay cells effect a timing resolution change. In the coupled delay line, each cell therefore outputs a different phase compared to incoming phase. This allows for coarse resolution which is made finer by interpolation.

The delay cell/delay line embodiments of the present invention may be used in a number of circuit applications. For example, these embodiments may be used to improve the resolution of timing signals input by a jitter injector during an evaluation of clock recovery circuits in an optical ink.

Figure 7:
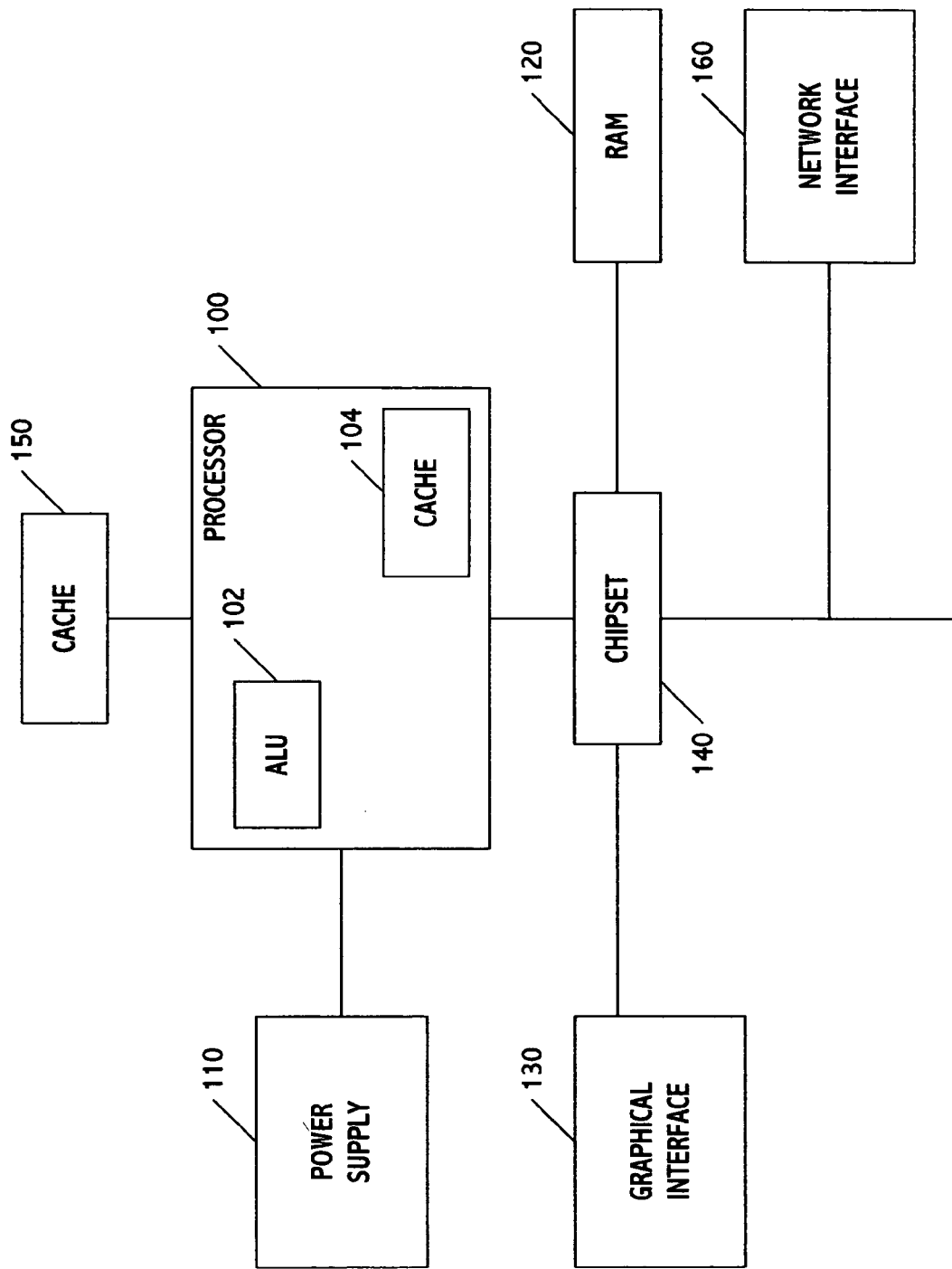
FIG. 7 is a diagram showing a processing system which includes at least one of a delay cell and delay line in accordance with one embodiment of the present invention.

FIG. 7 shows a processing system which corresponds to another application of the delay cell or delay line. In accordance with one embodiment, the processing system includes a processor 100, a power supply 110, and a memory 120 which, for example, may be a random-access memory. The processor may include an arithmetic logic unit 102 and an internal cache 104. In addition to these elements, the processing system may optionally include a graphical interface 130, a chipset 140, a cache 150 and a network interface 160.

A delay cell or delay line in accordance with any one or more of the embodiments of the present invention may be used in chipsets or a memory controller where the clock signal is embedded inside the data signal. If a microprocessor platform is designed to accept data bus or address bus without an explicit clock, this element will be used for testing of the link before assembling the final platform. The processing system including the timing circuit may be formed on a single chip die or one or more elements of the system may reside off-chip if desired.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

We claim:

1. A circuit, comprising:
    a first filter to filter first components of two differential input signals;
    a second filter to filter second components of the differential input signals; and
    a delay cell to generate a delayed differential signal based on outputs of the first and second filters, wherein the first components are positive components of the differential input signals and the second components are negative components of the differential input signals and wherein the first filter is coupled between the first components and the second filter is coupled between the second components.

2. The circuit of claim 1, wherein the first and second filters smooth a state transition in the delayed differential signal, the state transition corresponding to an offset that exists between the differential input signals.

3. The circuit of claim 2, wherein the offset is one of a time offset and phase offset.

4. The circuit of claim 2, wherein the delayed differential signal is a continuous time-varying signal.

5. The circuit of claim 1, wherein the first filter includes a resistor having a resistance value which smooths a state transition in a first component of the delayed differential signal.

6. The circuit of claim 5, wherein the second filter includes a resistor having a resistance value which smooths a state transition in a second component of the delayed differential signal.

7. The circuit of claim 1, wherein the delay cell includes:
a load;
a current source;
a first switching circuit to connect the current source to the load based on the first filtered components of the differential input signals;
a second switching circuit to connect the current source to the load based on the second filtered components of the differential input signals; and
terminals to output the delayed differential signal generated based on current flowing between the current source and load.

8. The circuit of claim 7, wherein the load includes a symmetric configuration of transistors.

9. A method for generating a delayed signal, comprising:
filtering first components of two differential input signals using a first filter coupled between the first components;
filtering second components of the differential input signals using a second filter coupled between the second components; and
generating a delayed differential signal based on the filtered components of the two differential input signals, wherein the first components are positive components of the differential input signals and the second components are negative components of the two differential input signals.

10. The method of claim 9, wherein filtering the first and second components smooths a state transition in the delayed differential signal, the state transition corresponding to an offset between the differential input signals.

11. The method of claim 10, wherein the offset is one of a time offset and phase offset.

12. The method of claim 11, wherein the delayed differential signal is a continuous time-varying signal.

13. The method of claim 9, wherein filtering the first components includes:
coupling the first components of the differential input signals through a first resistor.

14. The method of claim 13, wherein the first resistor has a resistance value which smooths a state transition in a first component of the delayed differential signal.

15. The method of claim 13, wherein filtering the second components includes: coupling the second components of the differential input signals through a second resistor.

16. The method of claim 15, wherein the second resistor has a resistance value which smooths a state transition in a second component of the delayed differential signal.

17. The method of claim 9, wherein generating the delayed differential signal includes:
connecting a current source to a load based on the first filtered components of the differential input signals;
connecting the current source to the load based on the second filtered components of the differential input signals; and
generating the delayed differential signal based on current flowing between the current source and load.

18. The method of claim 17, wherein the load includes a symmetric configuration of transistors.

19. A delay line, comprising:
a first delay cell which includes a first filter to filter first components of first and second differential signals, a second filter to filter second components of the first and second differential signals, and a delay circuit to generate a delayed differential signal based on outputs of the first and second filters; and
a second delay cell which generates a differential signal which includes the first and second components of the first differential signal input into the first delay cell, wherein the first components are positive components of the first and second differential signals and the second components are negative components of the first and second differential signals and wherein the first filter is coupled between the first components and the second filter is coupled between the second components.

20. The delay line of claim 19, further comprising:
a third delay cell which generates a differential signal which includes the first and second components of the second differential signal input into the first delay cell.

21. The delay line of claim 19, wherein the filters smooth a state transition in the delayed signal, the state transition corresponding to an offset that exists between the first and second differential signals.

22. The delay line of claim 21, wherein the offset is one of a time offset and phase offset.

23. The delay line of claim 19, wherein the filter of the first components includes a resistor having a resistance value which smooths a state transition in a first component of the delayed differential signal.

24. The delay line of claim 23, wherein the second filter includes a resistor having a resistance value which smooths a state transition in a second component of the delayed differential signal.

25. A system, comprising:
a first circuit; and
a second circuit including:
a first filter to filter first components of two differential input signals;
a second filter to filter second components of the differential input signals; and
a delay cell to generate a delayed differential signal based on outputs of the first and second filters, the delayed differential signal controlling the first circuit, wherein the first components are positive components of the first and second differential signals and the second components are negative components of the first and second differential signals and wherein the first filter is coupled between the first components and the second filter is coupled between the second components.

26. The system of claim 25, wherein the first circuit includes a chipset.

27. The system of claim 25, wherein the first circuit includes a memory controller.

* * * * *